United States Patent

Horchler et al.

[11] Patent Number: 6,157,239
[45] Date of Patent: Dec. 5, 2000

[54] INTEGRATED FULL BRIDGE CIRCUIT WITH FOUR TRANSISTORS

[75] Inventors: Wolfgang Horchler, Rosenheim; Reinhard Mueller, München, both of Germany

[73] Assignee: Infineon Technologies AG, Munich, Germany

[21] Appl. No.: 09/468,372

[22] Filed: Dec. 20, 1999

Related U.S. Application Data

[63] Continuation of application No. PCT/DE98/00995, Apr. 8, 1998.

[30] Foreign Application Priority Data

Jun. 18, 1997 [DE]  Germany ................. 197 25 835.2

[51] Int. Cl.[7] ................................................ H03K 17/56
[52] U.S. Cl. ...................... 327/423; 327/110; 327/588
[58] Field of Search ................................ 327/110, 108, 327/109, 587, 588, 423, 424; 363/63, 58, 56; 361/84, 18; 330/146

[56] References Cited

U.S. PATENT DOCUMENTS

| | | |
|---|---|---|
| 4,639,794 | 1/1987 | Ferrir ................................. 360/46 |
| 4,651,269 | 3/1987 | Matsumura ........................... 363/63 |
| 4,989,114 | 1/1991 | Storti et al. ......................... 361/84 |
| 5,543,747 | 8/1996 | Hayakawa et al. .................. 327/110 |
| 5,642,247 | 6/1997 | Giordano ............................ 327/110 |
| 5,757,215 | 5/1998 | Schuelke et al. ................... 327/110 |
| 5,990,710 | 11/1999 | Ngo et al. .......................... 327/110 |

*Primary Examiner*—Toan Tran
*Attorney, Agent, or Firm*—Herbert L. Lerner; Laurence A. Greenberg; Werner H. Stemer

[57] ABSTRACT

An integrated full bridge circuit includes four transistors divided into two series-connected pairs of transistors each forming a half bridge circuit. Resistor elements each connect a respective one of the pairs of transistors to a reference potential. Other resistor elements are each connected to a respective one of two separate supply terminals inside a housing. Each of the other resistor elements is connected to one of the transistors of a respective one of the pairs of transistors at a junction. Driver transistors each have a load path with two connections and a type complementary to the transistors connected to the other resistor elements. One of the connections is connected upstream of the control terminal of a respective one of the transistors connected to the other resistor elements. The other of the connections in each of the half bridge circuits is connected to the junction in the other of the half bridge circuits. The advantage is power loss reduction.

7 Claims, 2 Drawing Sheets

6,157,239

INTEGRATED FULL BRIDGE CIRCUIT WITH FOUR TRANSISTORS

CROSS-REFERENCE TO RELATED APPLICATION

This application is a continuation of copending International Application No. PCT/DE98/00995, filed Apr. 8, 1998, which designated the United States.

BACKGROUND OF THE INVENTION

Field of the Invention

The invention relates to an integrated full bridge circuit, including four transistors divided into two series-connected pairs of transistors each forming a half bridge, the pairs of transistors are each connected to reference potential through a respective resistor element and to one of two separate supply terminals inside a housing through a respective other resistor element, and upstream driver transistors of a complementary type are each connected to the control terminal of a respective one of the transistors connected to the other resistor elements.

Such integrated full bridge circuits are by now well known. An integrated full bridge circuit which is known from U.S. Pat. No. 4,989,114 has four transistors that are each connected to supply terminals through resistor elements disposed in the paths. The transistors of the upper bridge half each have an upstream driver transistor of the complementary type at their respective control terminals. A driver circuit for a bridge circuit which is known from U.S. Pat. No. 4,639,794 has a driver transistor connected to the control terminals of two transistors of the bridge circuit that are triggered diagonally. Thus, two transistors of the bridge circuit are triggered with one driver transistor.

Other examples of integrated circuit components include, among others, the TLE 4203 (Siemens) and L9937 (SGS-Thomson Microelectronics). The integrated TLE 4203 component is discussed below with reference to FIGS. 1 and 2.

A problem of those known bridge circuits is the power loss that occurs during operation. Specifically, the power loss is responsible for the fact that the integrated circuits in which such full bridge circuits are found sometimes heat up considerably.

SUMMARY OF THE INVENTION

It is accordingly an object of the invention to provide an integrated full bridge circuit with four transistors, which overcomes the hereinafore-mentioned disadvantages of the heretofore-known devices of this general type in such a way that its power loss is reduced markedly, as compared with known full bridge circuits.

With the foregoing and other objects in view there is provided, in accordance with the invention, an integrated full bridge circuit, comprising four transistors having control terminals, the four transistors including two series-connected pairs of transistors each forming a half bridge circuit; resistor elements each connecting a respective one of the pairs of transistors to a reference potential; other resistor elements each connected to a respective one of two separate supply terminals inside a housing, each of the other resistor elements connected to one of the transistors of a respective one of the pairs of transistors at a junction; and driver transistors each having a load path with two connections and a type complementary to the transistors connected to the other resistor elements, one of the connections connected upstream of the control terminal of a respective one of the transistors connected to the other resistor elements and the other of the connections in each of the half bridge circuits connected to the junction in the other of the half bridge circuits.

In comparison to the known full bridge circuits with driver transistors, the load terminals of the driver transistors are crossed and are each connected to the respective other half bridges. An advantage of this construction is the fact that with the driver transistor conducting and a downstream transistor conducting, only the driver current flows across the resistor element connected to the supply terminal of the other half bridge circuit, that is across the bond wire. The power loss can be reduced by approximately 5 to 10% by this provision according to the invention.

In accordance with another feature of the invention, the transistors are bipolar transistors, and the driver transistors are preferably PNP transistors.

In accordance with a further feature of the invention, the resistor elements are preferably bond wires of gold or aluminum, with a resistance of approximately 30 to 120 mω.

In accordance with a concomitant feature of the invention, the entire full bridge circuit can be integrated into a dual inline package, a dual small outline package, a transistor outline package, or a single in-line package housing, among others.

Other features which are considered as characteristic for the invention are set forth in the appended claims.

Although the invention is illustrated and described herein as embodied in an integrated full bridge circuit with four transistors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
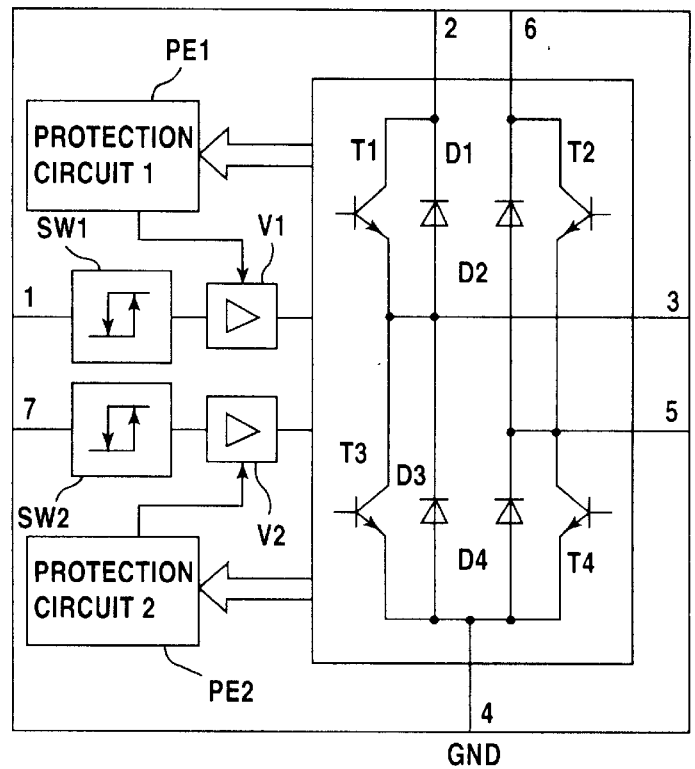
FIG. 1 is a schematic and block circuit diagram of a known TLE 4203 integrated full bridge circuit.

Referring now to the figures of the drawings in detail and first, particularly, to FIG. 1 thereof, there is seen a block circuit diagram of an integrated TLE 4203 component. The component has a total of seven accessible connections, which are occupied as follows:

1: Control input A
2: Supply voltage VD
3: Output A
4: Reference potential
5: Output B
6: Supply voltage VB
7: Control input B A motor can, for instance, be connected between the outputs 3 and 5. For example, the connections 2, 6 may be clamped to the positive pole of a car battery, and the connection 4 may be clamped to the negative pole of that battery. A suitable control circuit furnishes control signals that are inverted from one another to the connections 1, 7, so that the motor connected to the connections 3, 5 will rotate counterclockwise or clockwise.

The integrated circuit has a full bridge circuit, which in the present block circuit diagram is schematically formed by two parallel-connected half bridges with NPN bipolar transistors T1, T3 and T2, T4. Freewheeling diodes D1 . . . D4 are connected parallel to load paths of these four bipolar transistors T1 . . . T4. Specifically, a collector terminal of the transistor T1 and a cathode terminal of the freewheeling diode D1 are connected to the connection 2 for supply voltage VD. An emitter terminal of the transistor T3 and an anode terminal of the associated freewheeling diode D3 are conversely connected to the connection 4 for reference potential GND. A junction between an emitter terminal of the transistor T1, an anode terminal of the freewheeling diode D1, a collector terminal of the transistor T3, and a cathode terminal of the freewheeling diode D3 is connected to the connection 3 for the output A of the integrated circuit. The transistors T2, T4 and the associated freewheeling diodes D2, D4 are connected in a similar way between the connections 6 and 4 of the integrated circuit. A junction between those elements is in contact with the connection 5 for the output B.

The TLE 4203 integrated circuit furthermore has two protection circuits PE1, PE2. A threshold value switch SW1 with an amplifier V1 connected downstream thereof is connected between the connection 1 for the control input A and the full bridge circuit. Similarly, a threshold value switch SW2 with an amplifier V2 connected downstream thereof is connected between the connection 7 for the control input B and the full bridge circuit.

Figure 2:
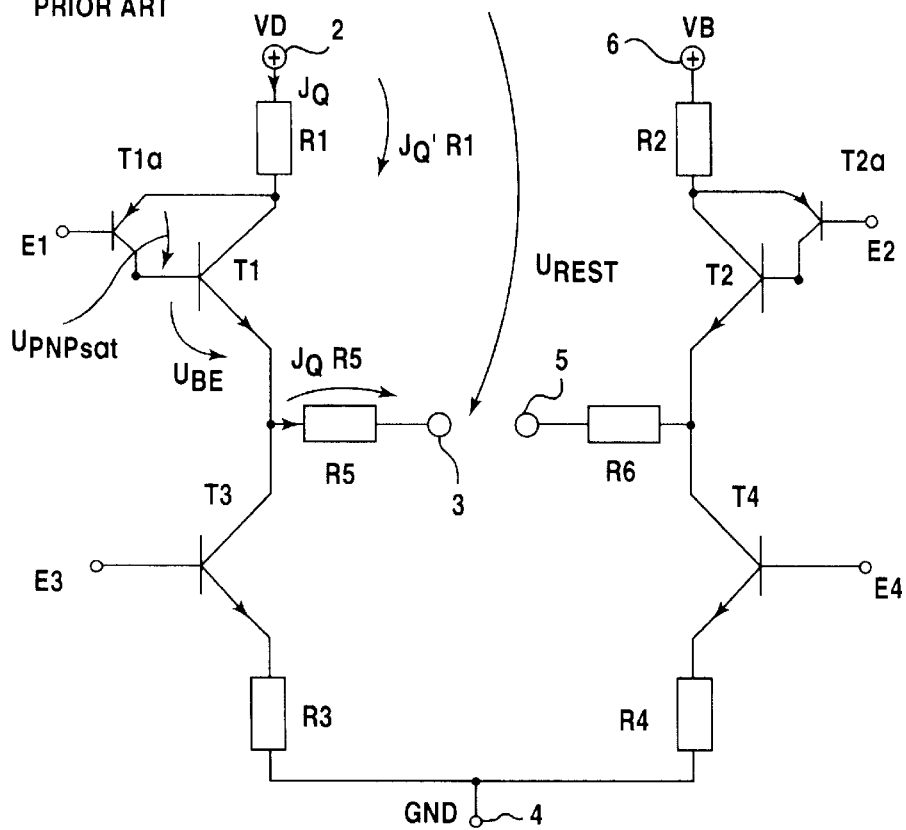
FIG. 2 is a more detailed schematic circuit diagram of the integrated circuit of FIG. 1.

The part of the circuit in the block circuit diagram of FIG. 1 that contains the full bridge circuit is shown enlarged and in more detail in FIG. 2. The reference numerals which were already mentioned stand for the components that have already been described. Resistor elements R1 . . . R6 which have been added in the circuit configuration of FIG. 2 are substantially predetermined by ohmic resistances of bond wires. These resistances are between about 30 and 120 mω. These bond wires are necessary in order to connect the terminals of the integrated circuit to connection terminals of a housing which can, for instance, be a dual in-line package. Specifically, these resistor elements which are made in the form of bond wires are wired as follows: The first resistor element R1 is located between the collector terminal of the transistor T1 and the connection 2 for supply voltage VD. The second resistor element R2 is located between the collector terminal of the transistor T2 and the connection 6 for supply voltage VB. The third resistor element R3 is connected between the emitter terminal of the transistor T3 and the connection 4 for reference potential GND, while the resistor element R4 is connected between the emitter terminal of the transistor T4 and the same connection 4. The fifth resistor element R5 is connected between the connection 3 and the junction of the emitter terminal of the transistor Ti and the collector terminal of the transistor T3, and the resistor element R6 is connected between the connection 5 and the junction of the emitter terminal of the transistor T2 and the collector terminal of the transistor T4.

The aforementioned transistors T1 . . . T4 are each NPN bipolar transistors. As is shown in FIG. 2, the two upper transistors T1 and T2 having collector terminals which are each connected to a respective supply voltage VD and VB through a respective resistor element R1 and R2, are connected as "quasi-PNP transistors". In other words, these transistors T1, T2 each draw their base current at their base terminals through a respective upstream PNP driver transistor T1a and T2a. To that end, a collector terminal of the driver transistor T1a is connected to the base terminal of the transistor T1 and an emitter terminal of the driver transistor T1a is connected to a junction between the resistor element R1 and the collector terminal of the transistor T1. A control terminal of the driver transistor T1a is in contact with an input terminal E1 of the full bridge circuit.

The driver transistor T2a is similarly connected to the transistor T2. An emitter terminal of the driver transistor T2a is in contact with the collector terminal of the transistor T2, and a collector terminal of the driver transistor T2a is in contact with the base terminal of the transistor T2. A base terminal of the driver transistor T2a is in contact with an input connection E2 of the full bridge circuit. The two driver transistors T1a, T2a are complementary in type to the transistors T1, T2, or in other words in this case they are PNP bipolar transistors.

Base terminals of the transistors T3, T4 are each in contact with a respective input terminal E3, E4 of the full bridge circuit.

As can be seen from FIGS. 1 and 2, in the integrated circuits, contacting line connections, in this case the collector terminals of the transistors T1 and T2, to the supply voltage, is often done through separate bond wires, in this case the separate resistor elements R1, R2. For instance, +12 volts from a car battery is applied to the two connections 2, 6. The two connections 2, 6 are required for layout reasons. This is the case firstly because in this way good symmetry of the integrated circuit can be attained and secondly because the two line connections 2, 6 reduce the current load on the two resistor elements R1, R2. The interconnection of the two connections 2, 6 is then performed externally.

A problem which is encountered in these known bridge circuits is the power loss that occurs during operation. Specifically, the power loss is responsible for the fact that the integrated circuits in which such full bridge circuits are found sometimes heat up considerably.

Figure 3:
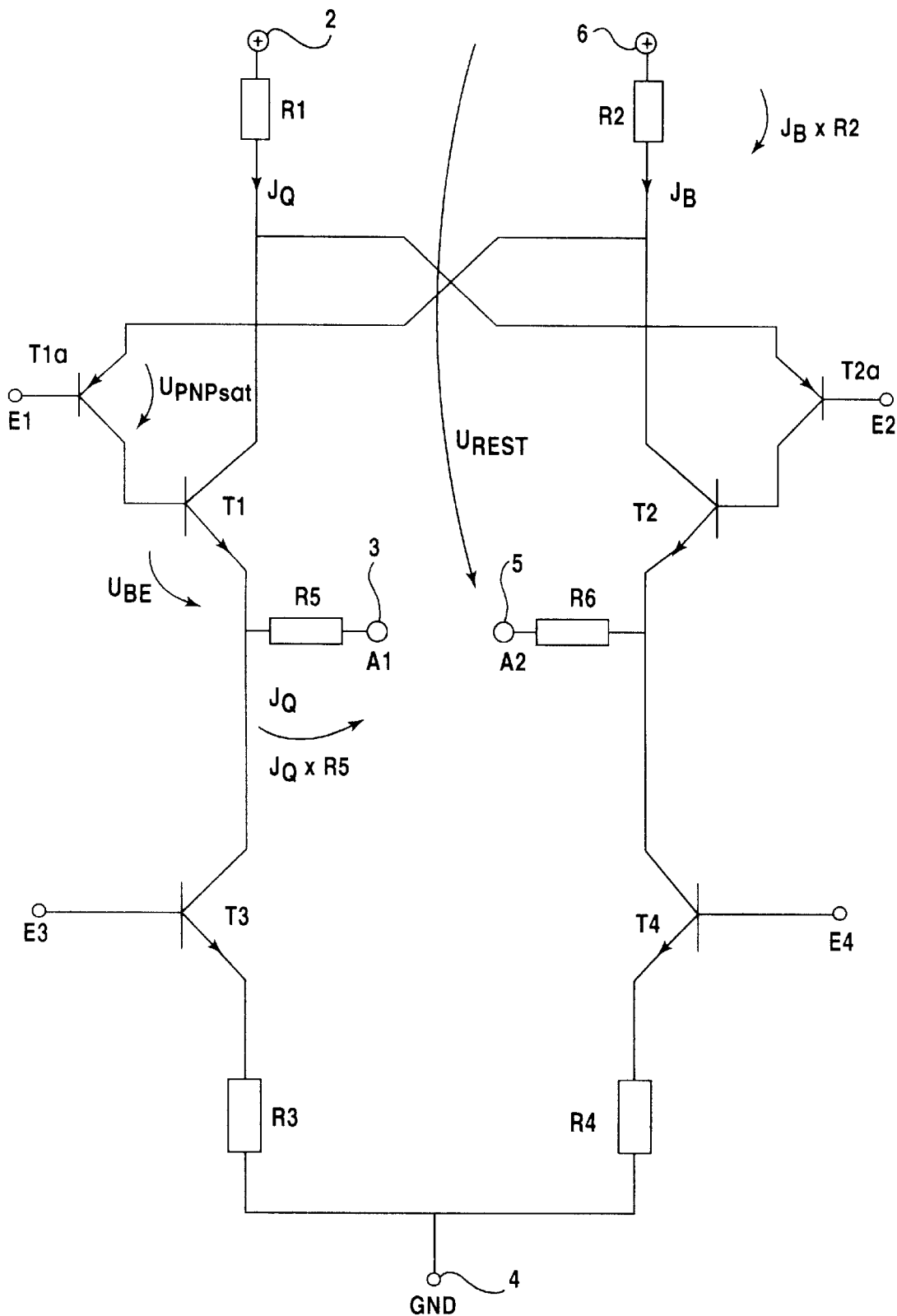
FIG. 3 is a schematic circuit diagram of the circuit configuration of the full bridge circuit of the invention, with crossed lead lines of driver transistors.

The circuit configuration of FIG. 3 is largely equivalent to the full bridge circuit shown in FIG. 2. The reference numerals already used will continue to be used for the same circuit components.

However, in contrast to the circuit configuration of FIG. 2, the emitter terminals of the two driver transistors T1a, T2a are now crossed relative to one another. Accordingly, the emitter terminal of the PNP driver transistor T1a is connected to the junction between the collector terminal of the transistor T2 and the resistor element R2. The emitter terminal of the other PNP driver transistor T2a is conversely connected to the junction that is located between the resistor element R1 and the collector terminal of the transistor T1.

The result with regard to a reduced power loss, in this full bridge circuit shown in FIG. 3, is as follows: It is assumed that the transistors T1a, T1 and T4 are conducting, because of corresponding control signals at the input terminals E1, E4. The other transistors T2, T2a and T3 are blocked. An electric load, such as a motor, is connected between the connections 3 and 5.

The voltage loss that is established between the two connections 6 and 3 is determined by the following formula:

$$I_B \times R2 + U_{PNPsat} + U_{BE} + I_Q \times R5 = U_{REST}.$$

In this formula, $I_B$ stands for control current, $I_Q$ stands for load current, $I_Q$ is 100 times $I_B$, U PNPsat is the saturation voltage of the driver transistor T1$a$, and $U_{BE}$ is the emitter voltage of the transistor T1.

If one assumes that the control current $I_B$ is approximately 100 times smaller than the load current $I_Q$, then the term $I_B \times R2$ is negligible.

The following equation then applies for the voltage loss:

$$U_{REST} = U_{PNPsat} + U_{BE} + I_Q \times R5.$$

If this is compared with the power loss that occurs in the upper branch of the bridge circuit in FIG. 2, the result is:

$$U_{REST} = I_Q \times R1 + U_{PNPsat} + U_{BE} + I_Q \times R5.$$

If the voltage losses occurring in the two circuits of FIGS. 2 and 3 are compared, in each case in the upper conducting part of the circuit, then it is clearly apparent that in the circuit of FIG. 3, the power loss is reduced by virtually the term $I_Q \times R1$. The consequence is a reduced power loss in the entire circuit.

We claim:

1. An integrated full bridge circuit, comprising:

four transistors having control terminals, said four transistors including two series-connected pairs of transistors each forming a half bridge circuit;

resistor elements each connecting a respective one of said pairs of transistors to a reference potential;

other resistor elements each connected to a respective one of two separate supply terminals inside a housing, each of said other resistor elements connected to one of said transistors of a respective one of said pairs of transistors at a junction; and driver transistors each having a load path with two connections and a type complementary to said transistors connected to said other resistor elements, one of said connections connected upstream of said control terminal of a respective one of said transistors connected to said other resistor elements and the other of said connections in each of said half bridge circuits connected to said junction in the other of said half bridge circuits.

2. The integrated full bridge circuit according to claim 1, wherein all of said transistors are bipolar transistors.

3. The integrated full bridge circuit according to claim 2, wherein said driver transistors are PNP bipolar transistors, and said four transistors are NPN bipolar transistors.

4. The integrated full bridge circuit according to claim 1, wherein said resistor elements are bond wires connecting connection terminals of an integrated circuit to terminals of an integrated chip onto which said four transistors and said driver transistors are integrated.

5. The integrated full bridge circuit according to claim 4, wherein said bond wires are formed of a metal selected from the group consisting of gold and aluminum.

6. The integrated full bridge circuit according to claim 1, wherein said resist or elements each have a resistance of approximately 30 to 120 mω.

7. An integrated full bridge circuit assembly, comprising an integrated full bridge circuit according to claim 1 integrated into a package selected from the group consisting of a dual in-line package, a dual small outline package, a transistor outline package and a single in-line package housing.

* * * * *